United States Patent
Pan et al.

(10) Patent No.: US 8,283,256 B1
(45) Date of Patent: Oct. 9, 2012

(54) METHODS OF FORMING MICRODEVICE SUBSTRATES USING DOUBLE-SIDED ALIGNMENT TECHNIQUES

(75) Inventors: Wanling Pan, San Jose, CA (US); Harmeet Bhugra, San Jose, CA (US)

(73) Assignee: Integrated Device Technology inc., San Jose, CA (US)

( * ) Notice: Subject to any disclaimer, the term of this patent is extended or adjusted under 35 U.S.C. 154(b) by 8 days.

(21) Appl. No.: 13/034,004

(22) Filed: Feb. 24, 2011

(51) Int. Cl.
*H01L 21/302* (2006.01)
*H01L 21/461* (2006.01)

(52) U.S. Cl. ........ 438/735; 438/456; 438/942; 438/975; 257/E21.023; 430/311; 430/314

(58) Field of Classification Search .................. 438/456, 438/942, 975; 257/E21.023; 430/311, 314
See application file for complete search history.

(56) References Cited

U.S. PATENT DOCUMENTS

| | | | | |
|---|---|---|---|---|
| 5,952,694 A | * | 9/1999 | Miyawaki et al. | 257/347 |
| 6,225,145 B1 | * | 5/2001 | Choi et al. | 438/120 |
| 2005/0006502 A1 | | 1/2005 | Schultz et al. | |
| 2007/0230721 A1 | * | 10/2007 | White et al. | 381/166 |
| 2008/0157283 A1 | * | 7/2008 | Moslehi | 257/618 |
| 2011/0140216 A1 | * | 6/2011 | Qu | 257/419 |

OTHER PUBLICATIONS

Gruber, M. et al., "Precise and Simple Optical Alignment Method for Double-Sided Lithography" *Applied Optics*, vol. 40, Issue 28, Oct. 1, 2001, pp. 5052-5055; doi:10.1364/AO.40.005052.

* cited by examiner

*Primary Examiner* — Leonard Chang
(74) *Attorney, Agent, or Firm* — Myers, Bigel et al.

(57) ABSTRACT

Methods of forming substrates having two-sided microstructures therein include selectively etching a first surface of the substrate to define a plurality of alignment keys therein that extend through the substrate to a second surface thereof. A direct photolithographic alignment step is then performed on a second surface of the substrate by aligning a photolithography mask to the plurality of alignment keys at the second surface. This direct alignment step is performed during steps to photolithographically define patterns in the second surface.

8 Claims, 3 Drawing Sheets

METHODS OF FORMING MICRODEVICE SUBSTRATES USING DOUBLE-SIDED ALIGNMENT TECHNIQUES

FIELD OF THE INVENTION

The present invention relates to microdevice fabrication techniques and, more particularly, to microdevice fabrication techniques that use double-sided alignment processes to define structures on opposing surfaces of a substrate.

BACKGROUND OF THE INVENTION

Many microfabrication processes require the formation of device structures on opposing sides of a substrate, such as a semiconductor wafer or layer. In one conventional microfabrication process, an image of alignment marks on a first mask is captured during the formation of first device structures in a first surface of the substrate using the first mask and photolithographic processing techniques. Then, during the formation of second device structures in a second surface of the substrate, an alignment step is performed indirectly based on the captured image rather than directly from a mask. During this alignment step, the captured image is aligned to alignment marks on the second surface. Unfortunately, this indirect alignment process may not provide sufficient alignment accuracy for applications requiring a high degree of alignment between the first and second device structures on opposing sides of a substrate (e.g., semiconductor wafer).

SUMMARY OF THE INVENTION

Methods of forming substrates having two-sided microstructures therein include selectively etching a first surface of the substrate to define a plurality of alignment keys therein that extend through the substrate to a second surface thereof. A direct photolithographic alignment step is then performed on a second surface of the substrate by aligning a photolithography mask to the plurality of alignment keys at the second surface. This direct alignment step is performed during steps to photolithographically define patterns in the second surface. In some embodiments of the invention, the substrate includes a semiconductor device layer therein and the step of selectively etching the alignment keys is preceded by forming a first plurality of device structures in the semiconductor device layer.

According to additional embodiments of the invention, the step of selectively etching is preceded by forming an electrically insulating layer on the second surface of the substrate and forming a semiconductor handling layer (e.g., handling wafer) on the electrically insulating layer. According to these embodiments of the invention, the step of selectively etching includes selectively etching the first surface of the substrate to define a plurality of alignment keys therein that extend through the substrate and expose the electrically insulating layer.

According to still further embodiments of the invention, the step of forming a photolithographically defined pattern can be preceded by bonding a semiconductor capping layer to the first surface of the substrate. In addition, the step of forming a photolithographically defined pattern may be preceded by removing the semiconductor handling layer and the electrically insulating layer in sequence to thereby expose the second surface of the substrate and the plurality of alignment keys. This step of forming a photolithographically defined pattern may also be preceded by depositing a layer of photoresist material on the second surface of the substrate.

Additional embodiments of the invention may include methods of forming a microdevice substrate by selectively etching a first surface of a semiconductor device layer to define at least one alignment key therein, which extends entirely through the semiconductor device layer to a second surface thereof. A photolithographically defined pattern is then formed in the second surface of the semiconductor device layer by aligning a photolithography mask to the at least one alignment key on the second surface. The step of selectively etching may be preceded by forming a substrate comprising an electrically insulating layer on a semiconductor handling layer and the semiconductor device layer on the electrically insulating layer. The step of selectively etching may also include selectively etching a first surface of the semiconductor device layer to define at least one alignment key therein that extends entirely through the semiconductor device layer and exposes the electrically insulating layer. The semiconductor handling layer and at least a portion of the electrically insulating layer may be removed from the second surface of the semiconductor device layer before the photolithographically-defined pattern is formed in the second surface. A semiconductor capping layer may also be bonded to the first surface of the semiconductor device layer.

According to still further embodiments of the invention, a method of forming a substrate having microelectromechanical resonators therein may include selectively etching a first surface of the substrate having a plurality of resonator device structures therein to define at least one alignment key therein that extends partially through the substrate. A second surface of the substrate is then recessed to expose the at least one alignment key. At least one photolithographically defined pattern is formed in the second surface by aligning a photolithography mask to the at least one alignment key at the second surface. According to some of these embodiments of the invention, the recessing includes chemically-mechanically polishing the second surface of the substrate to expose the at least one alignment key. Alternatively, the recessing may include thermally oxidizing the second surface of the substrate for a sufficient duration to define an optically transparent oxide layer on the second surface that exposes the at least one alignment key. In additional embodiments of the invention, the step of forming at least one photolithographically defined pattern may include selectively removing portions of the optically transparent oxide layer to expose the second surface. Moreover, in the event one or more non-transparent layers are deposited on the optically transparent oxide layer, which render the alignment keys non-visible to photolithographic imaging equipment, then respective portions of these non-transparent layers can be removed using a relatively low-accuracy photolithographic masking step to thereby expose the alignment keys.

DETAILED DESCRIPTION OF EMBODIMENTS OF THE INVENTION

Figure 1A:
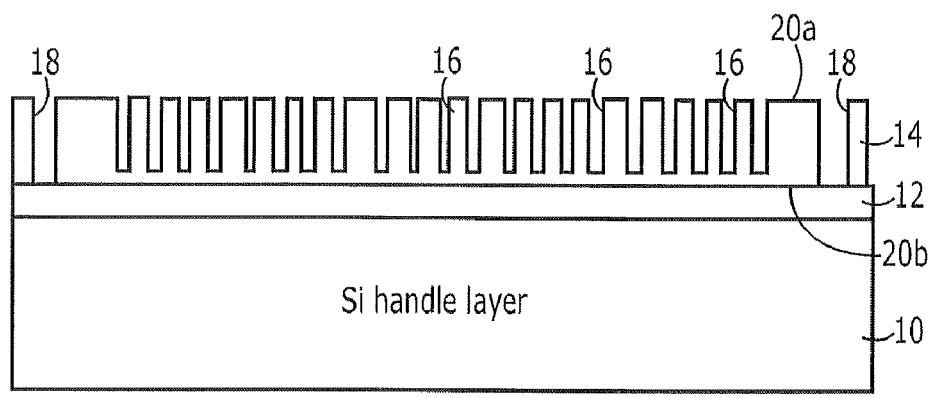
FIGS. 1A-1D illustrate methods of forming substrates having two-sided microstructures therein, according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIGS. 1A-1D, a method of forming a substrate having two-sided microstructures therein according to embodiments of the invention includes forming device structures 16 and alignment keys 18 in a first surface 20a of a semiconductor-on-insulator substrate (SOI). This SOI substrate is illustrated as containing a handling layer 10 (e.g., semiconductor wafer), an electrically insulating layer 12 (e.g., silicon dioxide layer) on the handling layer 10, and a semiconductor device layer 14 on the electrically insulating layer 12. In some embodiments, the device structures 16, which extend only partially through the semiconductor device layer 14, and the alignment keys 18, which may extend entirely through the semiconductor device layer 14 to a second surface 20b of the semiconductor device layer 14, may be simultaneously etched using techniques that cause the etch rate associated with the alignment keys 18 to be greater than the etch rate associated with the device structures 16. Alternatively, a photoresist layer (not shown) may be deposited on the first surface 20a of the semiconductor device layer 14 after the device structures 16 and intermediate alignment marks (not shown) are concurrently etched. This photoresist layer may then be patterned to expose only the intermediate alignment marks and support further selective etching of the bottoms of the intermediate alignment marks until the second surface 20b is reached and the alignment marks 18 are fully defined.

Figure 1B:
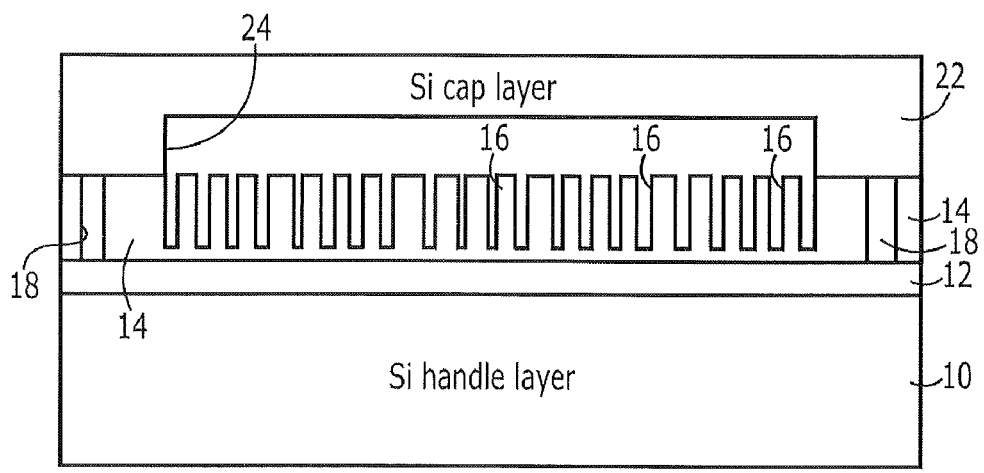

As illustrated by FIG. 1B, a capping layer 22 having a recess 24 therein is bonded to the first surface 20a of the semiconductor device layer 14. As illustrated, the dimensions of the recess 24 may be sufficient to provide a sealed cavity to the device structures 16, which may be microelectromechanical resonator structures. Examples of microelectromechanical resonator structures that may be used in embodiments of the invention are disclosed in U.S. Pat. Nos. 7,834,524 and 7,888,843 and U.S. Patent Pub. Nos. 2010/0194241 and 2010/0319185, the disclosures of which are hereby incorporated herein by reference. In some embodiments of the invention, the capping layer 22 may be a semiconductor (e.g., silicon) wafer having a preformed recess(es) therein.

Figure 1C:
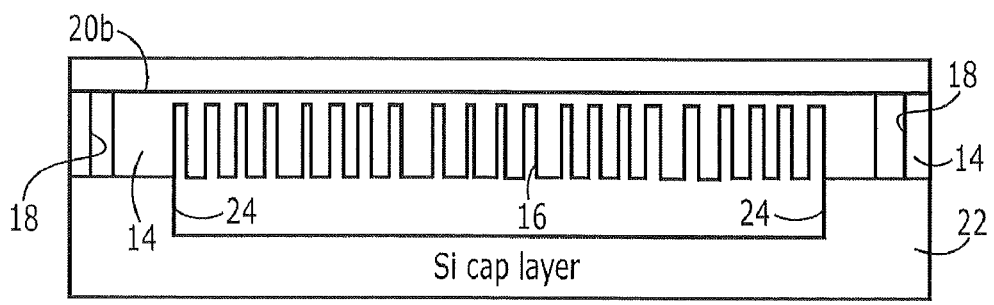
Figure 1D:
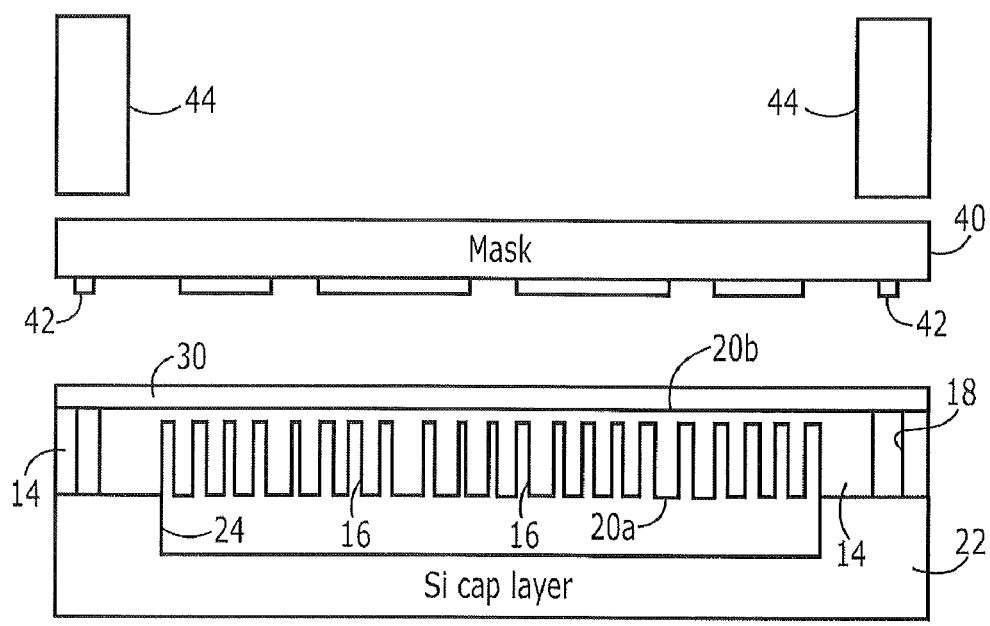

FIGS. 1C-1D illustrate the exposure of the alignment marks 18 at the second surface 20b of the semiconductor device layer 14, which is caused by the removal of the handling layer 10 and the electrically insulating layer 12 using conventional techniques. These techniques include wafer grinding, deep reactive ion etching (DRIE) and chemical-mechanical polishing (CMP) for the handling layer 10 and dry or wet etching (e.g., wet HF solution) for the electrically insulating layer 12. The second surface 20b of the semiconductor device layer 14 may then be covered with a photoresist layer 30, which is subsequently patterned using a photolithographically-defined exposure process. This exposure process may including the use of a mask 40 and photolithographic processing equipment. This processing equipment can contain lens elements 44 that enable high precision alignment between alignment patterns 42 on the mask 40 and the alignment marks 18 exposed at the second surface 20b of the semiconductor device layer 14.

Figure 2A:
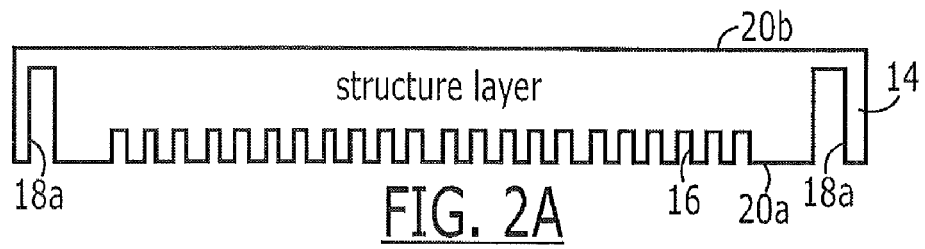
FIGS. 2A-2C illustrate methods of forming substrates having two-sided microstructures therein, according to embodiments of the invention.
Figure 2B:
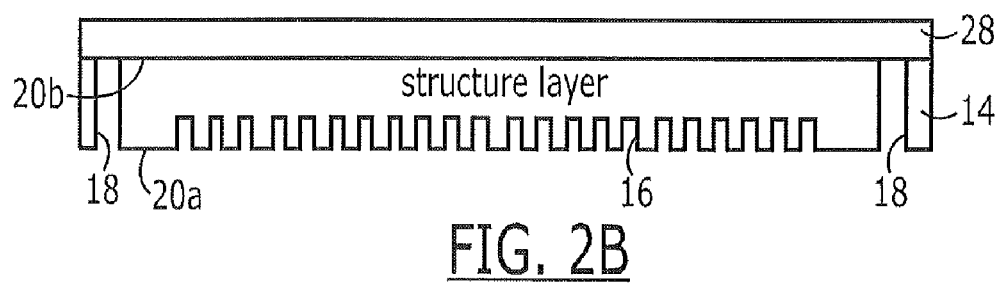
Figure 2C:
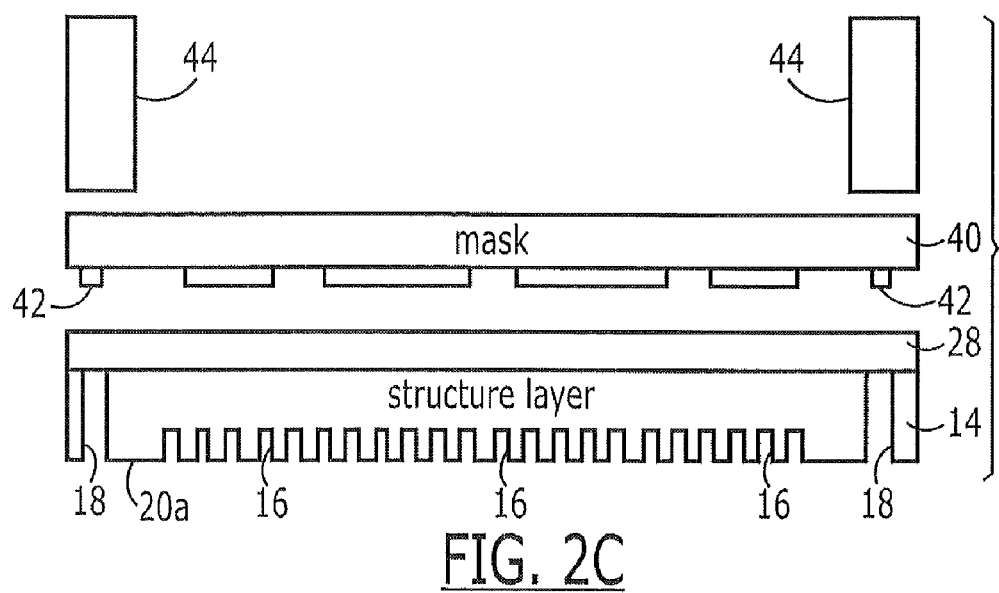

Referring now to FIGS. 2A-2C, an additional method of forming a substrate having two-sided microstructures therein includes forming device structures 16 and intermediate alignment keys 18a in a first surface 20a of a substrate, which contains a semiconductor device layer 14. The device structures 16 and the deeper intermediate alignment keys 18a extend partially through the semiconductor device layer 14, as illustrated by FIG. 2A. FIG. 2B illustrates the thermal oxidation of the second surface 20b of the substrate, which results in the formation of an optically transparent thermal oxide layer 28. This layer 28 is made sufficiently thick to thereby recess the second surface 20b of the semiconductor device layer 14 to a sufficient degree to encounter bottoms of the alignment keys 18. As illustrated by FIG. 2C, the alignment patterns 42 on the mask 40 can then be aligned to the alignment keys 18 using conventional techniques. According to some embodiments of the invention, the thermal oxide layer 28 is typically formed to a thickness of a few microns in order to maintain a high degree of optical transparency.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a substrate having two-sided microstructures therein, comprising:
   selectively etching a first surface of the substrate to define a plurality of alignment keys therein that extend through the substrate to a second surface thereof;
   bonding a semiconductor capping layer to the selectively etched first surface of the substrate, said semiconductor capping layer having a recess therein extending opposite the first surface; and then
   forming a photolithographically defined pattern in the second surface by aligning a photolithography mask to the plurality of alignment keys at the second surface.

2. The method of claim 1, wherein the substrate comprises a semiconductor device layer therein; and wherein said selectively etching is preceded by forming a first plurality of device structures in the semiconductor device layer; and wherein the recess extends opposite the first plurality of device structures.

3. The method of claim 1, wherein said selectively etching is preceded by forming an electrically insulating layer on the second surface of the substrate and forming a semiconductor handling layer on the electrically insulating layer; and wherein said selectively etching comprises selectively etching the first surface of the substrate to define a plurality of alignment keys therein that extend through the substrate and expose the electrically insulating layer.

4. The method of claim 3, wherein said forming a photolithographically defined pattern is preceded by removing the semiconductor handling layer and the electrically insulating layer in sequence to thereby expose the second surface of the substrate and the plurality of alignment keys.

5. The method of claim 4, wherein said forming a photolithographically defined pattern is preceded by depositing a layer of photoresist material on the second surface of the substrate.

6. A method of forming a microdevice substrate, comprising:
   selectively etching a first surface of a semiconductor device layer to define at least one alignment key therein that extends entirely through the semiconductor device layer to a second surface thereof;
   bonding a semiconductor capping layer to the selectively etched first surface of the semiconductor device layer, said semiconductor capping layer having a recess therein extending opposite the first surface; and then
   forming a photolithographically defined pattern in the second surface of the semiconductor device layer by aligning a photolithography mask to the at least one alignment key on the second surface.

7. The method of claim 6, wherein said selectively etching is preceded by forming a substrate comprising an electrically insulating layer on a semiconductor handling layer and the semiconductor device layer on the electrically insulating layer; and wherein said selectively etching comprises selectively etching a first surface of the semiconductor device layer to define at least one alignment key therein that extends entirely through the semiconductor device layer and exposes the electrically insulating layer.

8. The method of claim 7, wherein said forming a photolithographically defined pattern is preceded by removing the semiconductor handling layer and at least a portion of the electrically insulating layer from the second surface of the semiconductor device layer.

* * * * *